(12) United States Patent
Makino et al.

(10) Patent No.: US 8,895,876 B2
(45) Date of Patent: Nov. 25, 2014

(54) TERMINAL PROTECTION COVER AND ELECTRICAL JUNCTION BOX

(71) Applicant: Yazaki Corporation, Tokyo (JP)

(72) Inventors: Masahiro Makino, Makinohara (JP); Takanori Kawai, Miyoshi (JP); Yoshiyuki Ishihara, Toyota (JP)

(73) Assignee: Yazaki Corporation, Tokyo (JP)

( * ) Notice: Subject to any disclaimer, the term of this patent is extended or adjusted under 35 U.S.C. 154(b) by 63 days.

(21) Appl. No.: 13/904,213

(22) Filed: May 29, 2013

(65) Prior Publication Data

US 2013/0319754 A1    Dec. 5, 2013

(30) Foreign Application Priority Data

May 29, 2012   (JP) ................................. 2012-121551

(51) Int. Cl.
*H05K 5/00*  (2006.01)
*H01R 13/46*  (2006.01)
*H05K 5/03*  (2006.01)
*H01R 9/22*  (2006.01)
*H01R 13/42*  (2006.01)

(52) U.S. Cl.
CPC .................. *H01R 13/46* (2013.01); *H05K 5/03* (2013.01); *H01R 9/223* (2013.01); *H01R 13/42* (2013.01)
USPC ............................ 174/520; 174/59; 439/76.2

(58) Field of Classification Search
USPC ..................................... 174/520, 59; 439/76.2
See application file for complete search history.

(56) References Cited

U.S. PATENT DOCUMENTS

| | | | | |
|---|---|---|---|---|
| 6,007,350 A * | 12/1999 | Isshiki | ......................... | 439/76.2 |
| 6,524,136 B2 * | 2/2003 | Kawaguchi et al. | ...... | 439/620.26 |
| 6,552,268 B2 * | 4/2003 | Daoud et al. | .................... | 174/59 |
| 6,884,090 B2 * | 4/2005 | Kubota | ......................... | 439/76.2 |
| 6,910,923 B2 * | 6/2005 | Nakanishi | ................ | 439/620.26 |
| 7,021,962 B2 * | 4/2006 | Kiyota | .......................... | 439/528 |
| 2004/0112624 A1 * | 6/2004 | Kubota | ........................... | 174/59 |
| 2004/0198080 A1 * | 10/2004 | Kiyota | ......................... | 439/76.2 |

FOREIGN PATENT DOCUMENTS

JP          3364872 B2    11/2002

* cited by examiner

*Primary Examiner* — Hung V Ngo
(74) *Attorney, Agent, or Firm* — Sughrue Mion, PLLC

(57) ABSTRACT

A terminal holding part of a terminal protection cover includes a pair of lateral shaking-preventing wall parts which stands from a terminal-attachment surface of the terminal protection cover, and has surfaces facing lateral end edge surfaces, respectively, of the bent plate-type terminal which is held therein. The terminal holding part further includes a first vertical shaking-preventing wall part and a second vertical shaking-preventing wall part provided at a position upwards from the first vertical shaking-preventing wall part. The second vertical shaking-preventing wall part has a surface which is on the same side as the tip end edge surface of the lateral shaking-preventing wall part, and which is formed to be recessed relative to the tip end edge surface at a certain position at least upwards from an end edge surface of the second vertical shaking-preventing wall part.

5 Claims, 16 Drawing Sheets

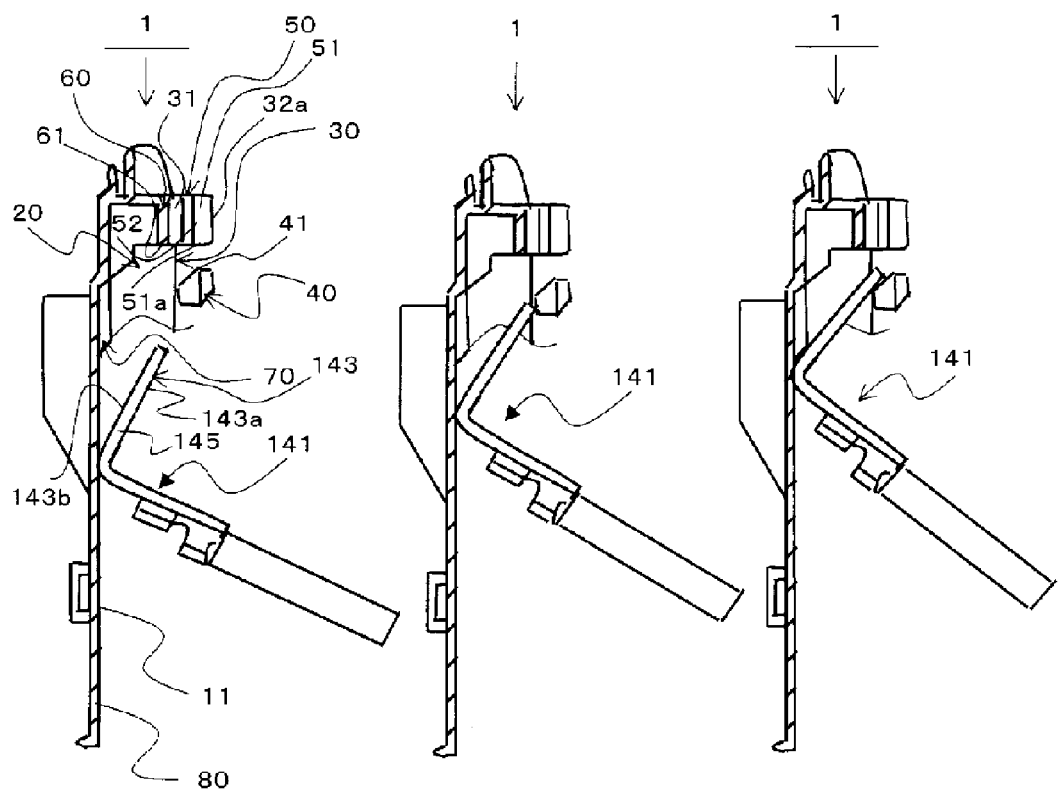

TERMINAL PROTECTION COVER AND ELECTRICAL JUNCTION BOX

BACKGROUND OF THE INVENTION

1. Field of the Invention

The present invention relates, in general, to a terminal protection cover having a terminal holding part in which a bent terminal, which is formed by bending a plate-type conductive member at right angle, is held, and an electrical junction box incorporating the terminal protection cover.

2. Description of the Related Art

Conventionally, an electrical junction box, which is mounted in a vehicle or the like, is equipped with an electric wire having a terminal, which is attached to an outer surface of the electrical junction box, with the terminal protected by a terminal protection cover. For example, Japanese Patent No. 3364872 discloses a terminal protection cover to which a terminal of an electric wire is easily attached.

The terminal protection cover disclosed in Japanese Patent No. 3364872 is configured such that a terminal-pressing plate is mounted opposite a board part, a terminal insertion gap is formed between the terminal-pressing plate and the board part, and a terminal mounting wall is provided perpendicular to the terminal-pressing plate, so that a right-angled plate-type terminal is inserted into the terminal insertion gap and is turned towards the terminal mounting wall so as to mount the terminal to the terminal protection cover.

The applicant proposes a terminal protection cover to which a terminal is mounted by turning action and which is denoted by reference numeral 700 in FIG. 15. The terminal protection cover 700 includes a terminal holding part 710 in which a bent plate-type terminal 800, which is formed by bending a plate-type conductive member at a right angle, is held. The terminal holding part 710 has an opening 711a on a wall 711 opposite a surface 700a against which the bent-plate-type terminal 800 abuts. The bent plate-type terminal 800 is held in the opening 711a by inserting the terminal into the opening 711a while turning the terminal towards the opening. The bent plate-type terminal 800, which has been mounted to the terminal protection cover through the terminal holding part 710, is prevented from shaking vertically and horizontally by an inner edge surface 712 of the opening 711a.

SUMMARY OF THE INVENTION

However, the above-mentioned terminal protection cover 700 needs to preset a vertical width T of the opening 711a so as to prevent an upper edge surface 712a of the opening 711a from interfering with a motion of the bent plate-type terminal 800 when inserted into the opening 711a through turning action, as shown in FIG. 16. Thus, a gap C formed between the bent plate-type terminal 800 and the opening 711a causes the bent plate-type terminal 800 to shake.

Accordingly, the present invention has been made keeping in mind the above problems, and one non-limited object of the present invention is to provide a terminal protection cover facilitating easy attachment of a bent plate-type terminal thereto and preventing the bent plate-type terminal from shaking, and an electrical junction box incorporating the terminal protection box.

An aspect of the present invention provides a terminal protection cover including a terminal holding part for holding a bent plate-type terminal formed by bending a plate-type conductive member at a right angle, wherein the terminal holding part includes: a pair of lateral shaking-preventing wall parts which stands from a terminal-attachment surface of the terminal protection cover, and have surfaces facing lateral end edge surfaces, respectively, of the bent plate-type terminal which is held therein; a first vertical shaking-preventing wall part which is a first wall extending between tip end edges of the pair of the lateral shaking-preventing wall parts on a side toward which the lateral shaking-preventing wall parts stand, and has first end edge surfaces facing inner surfaces, respectively, of a leading-side bent part of the bent plate-type terminal which is held therein; and a second vertical shaking-preventing wall part which is either a wall extending between the tip end edge surfaces of the pair of lateral shaking-preventing wall parts, or a pair of protruding walls extending from respective one of the tip end edge surfaces of the pair of lateral shaking-preventing wall parts towards the other one of the tip end edge surfaces of the pair of lateral shaking-preventing wall part, at a position upwards from the first vertical shaking-preventing wall part, and has a second end edge surface facing an outer surface of the leading-side bent part of the bent plate-type terminal which is held therein, wherein the second vertical shaking-preventing wall part has a surface which is on the same side as the tip end edge surface of the lateral shaking-preventing wall part, and which is formed to be recessed relative to the tip end edge surface at a certain position upwards from the second end edge surface, or from the second end edge surface to an upper edge surface therefrom.

In a second aspect of the present invention, the terminal protection cover may be configured so that the second vertical shaking-preventing wall part is the pair of protruding wall parts, and a surface of each of the protruding wall parts on the same side as the tip end edge surface is inclined so that a thickness of the protruding wall part decreases in a direction of protrusion.

In a third aspect of the present invention, the terminal protection cover may be configured so that the second vertical shaking-preventing wall part is the pair of protruding wall parts, and the terminal holding part further includes a third vertical shaking-preventing wall part which stands from the terminal-attachment surface between the pair of protruding wall parts to a level recessed relative to the tip end edge surface, and has a third end edge surface facing the outer surface of the leading-side bent part of the bent plate-type terminal which is held therein.

In a fourth aspect of the present invention, the terminal protection cover may be configured so that the terminal holding part further includes a guiding wall part which guides the bent plate-type terminal to an attachment-completion position when the bent plate-type terminal is being attached.

A fifth aspect of the present invention provides an electrical junction box in which a terminal-fitted electric wire having a bent plate-type terminal is attached to an outer surface of the electrical junction box, the electrical junction box including the terminal protection cover for protecting the bent plate-type terminal.

According to the terminal protection cover of the first aspect of the present invention, since the bent plate-type terminal is mounted such that the leading-side bent part thereof is disposed at a position surrounded by the first and second vertical shaking-preventing wall parts, and the pair of lateral shaking-preventing wall parts, and the surface of the second vertical shaking-preventing wall part on the same side as the standing-side tip end edge surface is recessed relative to the tip end edge surface, a distance between the first and second end edge surfaces can be set to the minimum so that the second vertical shaking-preventing wall part is prevented from interfering with a motion of the bent plate-type terminal when mounted to the terminal protection cover, thereby facilitating easy mounting of the bent plate-type terminal and preventing the bent plate-type terminal from shaking.

According to the terminal protection cover of second aspect of the present invention, in a case where the second vertical shaking-preventing wall part consists of a pair of protruding wall parts, each of the protruding wall parts has, on the same side as the tip end edge surface in the standing direction, an inclined surface whose thickness decreases in the direction of protrusion, so that, in a case where the leading end side of the bent plate-type terminal has a circular shape, a cross section area of the protruding wall part can be set to the maximum, thereby increasing the strength of the protruding wall parts, and the second end edge surface can be set to have a large area such that the second end edge surface is opposite the outer surface of the leading-side bent part of the bent plate-type terminal, thereby improving the shaking-preventing effects of the bent plate-type terminal.

According to the terminal protection cover of the third aspect of the present invention, the third vertical shaking-preventing wall part is provided between the pair of protruding wall parts such that the third vertical shaking-preventing wall part does not interfere with a motion of the bent plate-type terminal, thereby further improving the shaking-preventing effects of the bent plate-type terminal.

According to the terminal protection cover of the fourth aspect of the present invention, the bent plate-type terminal is guided along the guiding wall part to an attachment-completion position, thereby facilitating easy mounting of the bent plate-type terminal.

According to the electrical junction box of the fifth aspect of the present invention, the bent plate-type terminal is protected by the terminal protection cover, thereby facilitating easy mounting of the bent plate-type terminal and preventing the shaking of the bent plate-type terminal.

BRIEF DESCRIPTION OF THE DRAWINGS

In the accompanying drawings:

FIGS. 8A to 8C are side views showing a procedure of attaching a bent plate-type terminal to the terminal protection cover;

DETAILED DESCRIPTION OF THE EXEMPLARY EMBODIMENTS

Embodiments of a terminal protection cover and an electrical junction box will now be described in detail with reference to the accompanying drawings.

Embodiment

Figure 1:
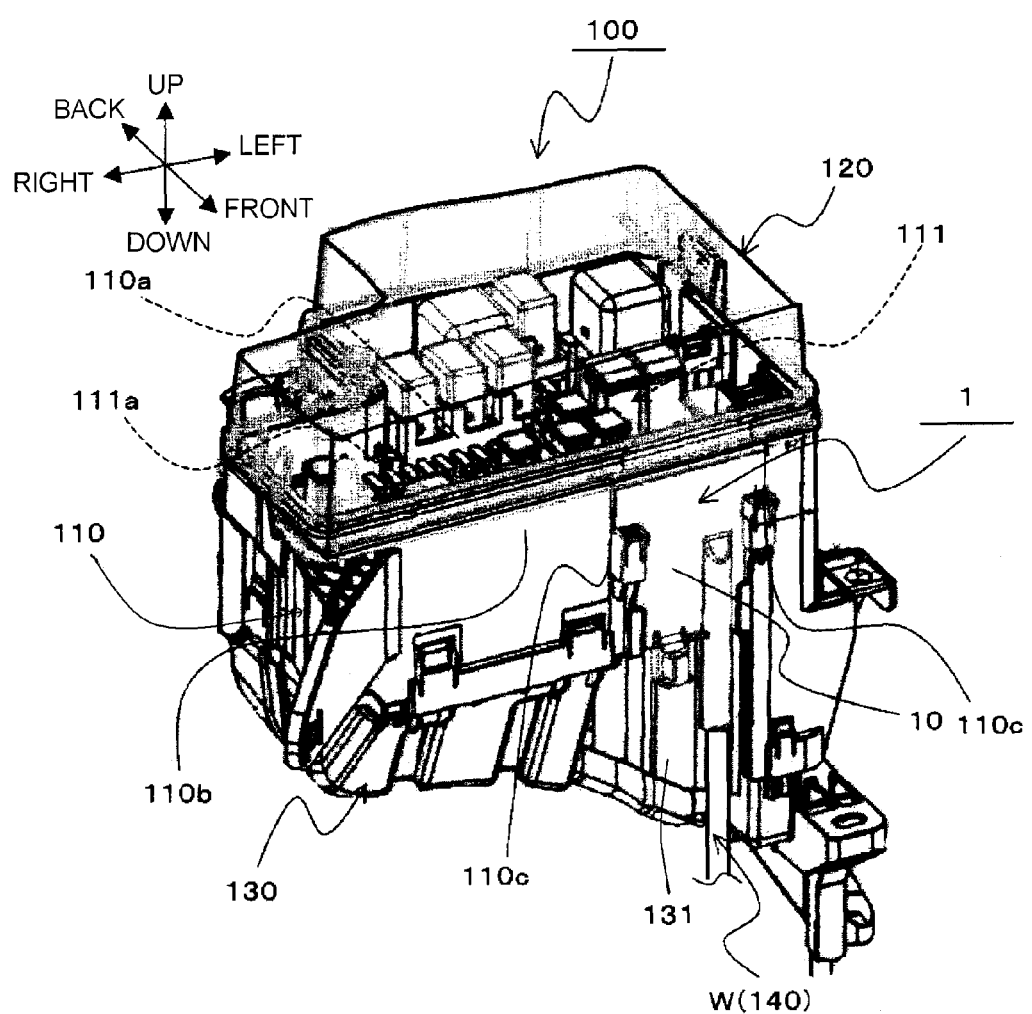
FIG. 1 is a perspective view of a terminal protection cover and an electrical junction box according to an embodiment of the present invention.

FIG. 1 is a perspective view of a terminal protection cover 1 and an electrical junction box 100 according to an embodiment of the present invention.

Here, FIG. 1 shows the inside of the electrical junction box by penetrating an upper cover section 120.

Figure 2:
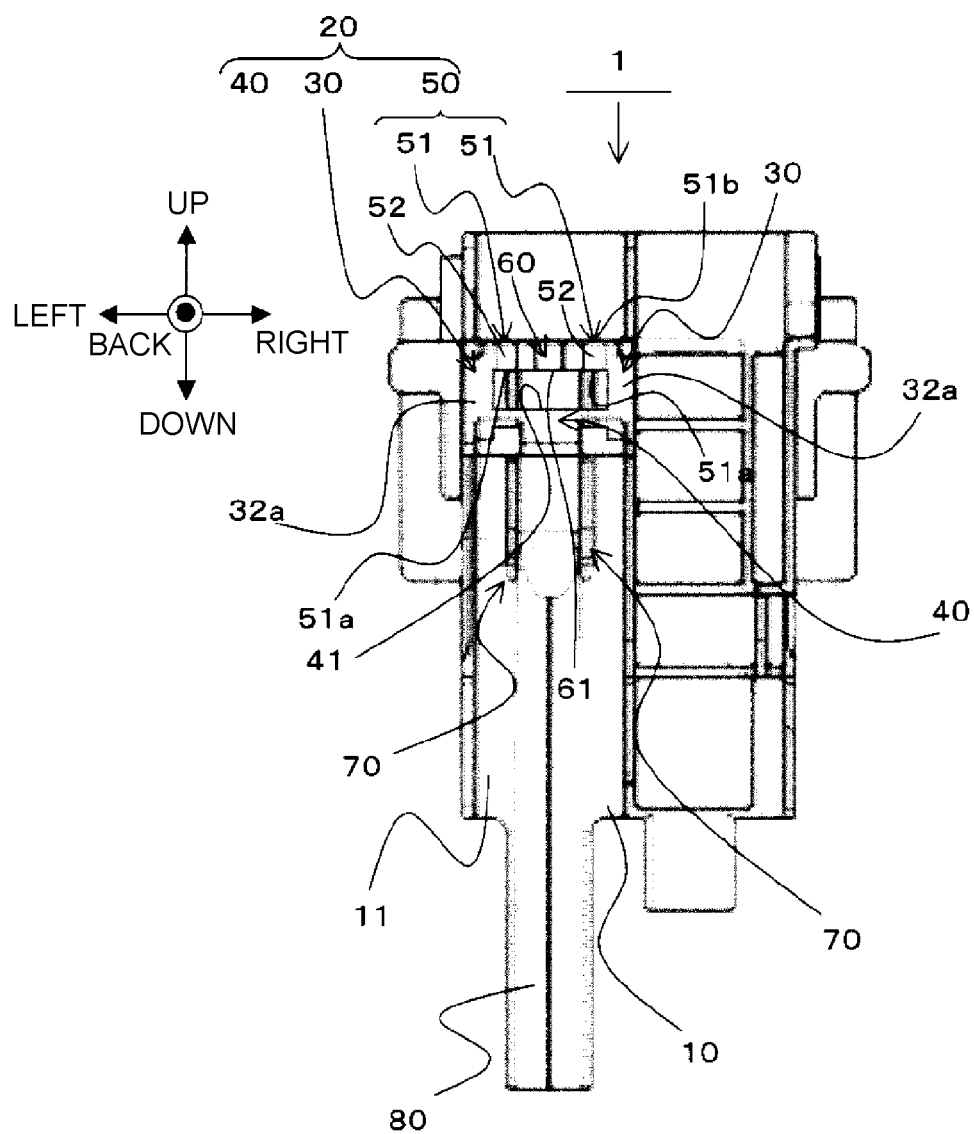
FIG. 2 is a side view of the terminal protection cover shown in FIG. 1 when viewed from a side for attaching the terminal protection cover.
Figure 3:
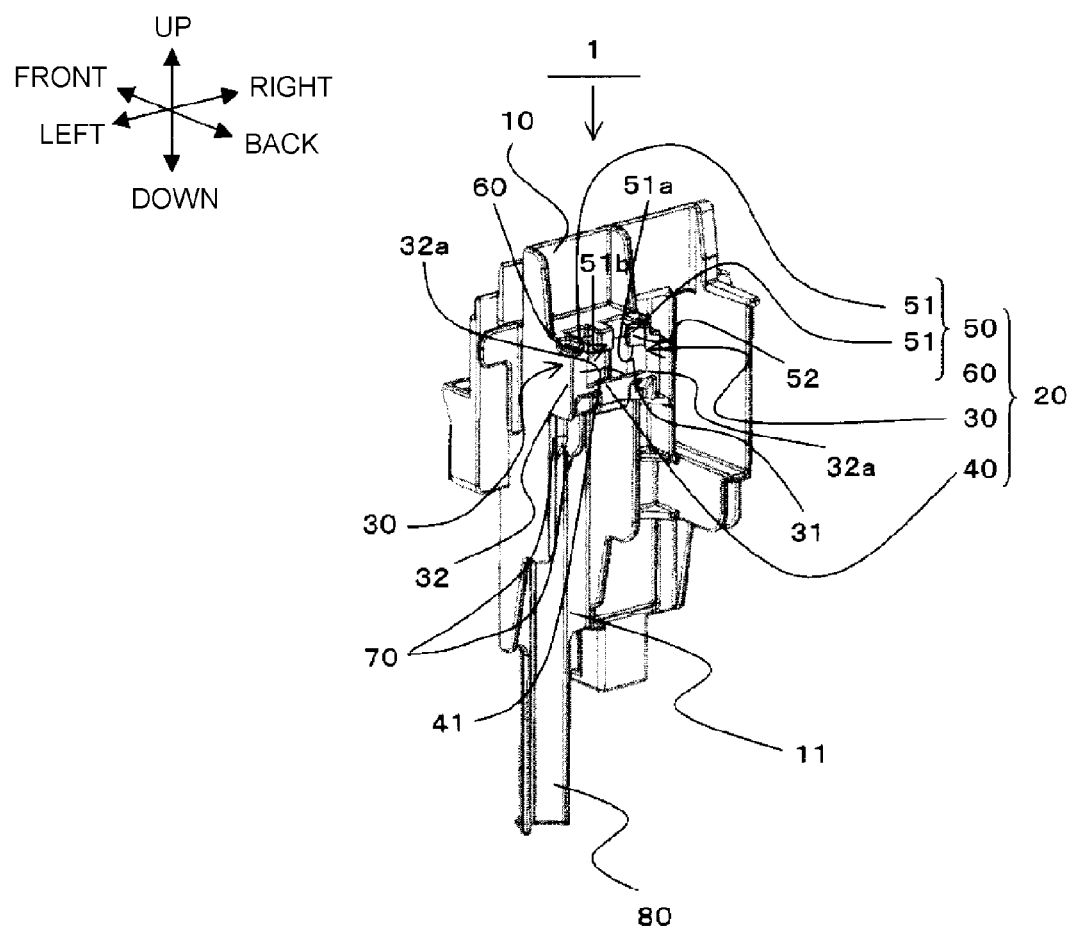
FIG. 3 is a perspective view of the terminal protection cover shown in FIG. 1 when viewed from a side for attaching the terminal protection cover.
Figure 4:
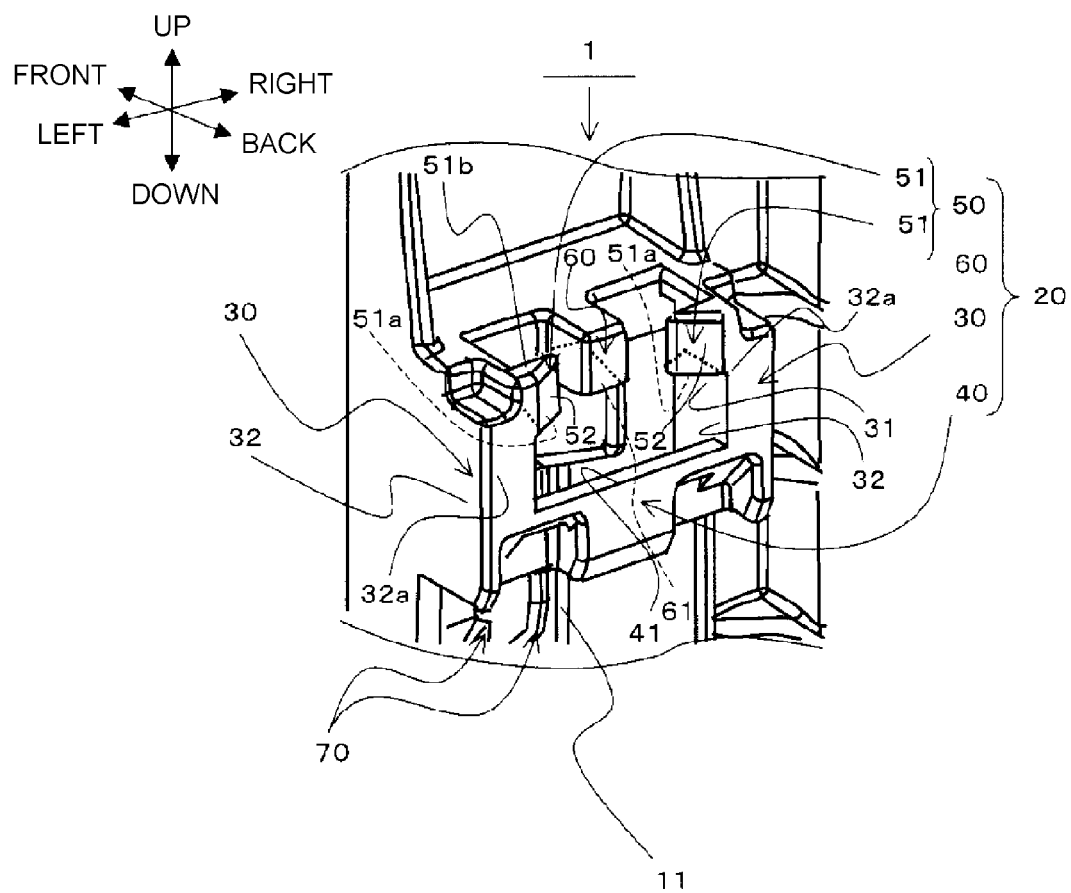
FIG. 4 is an enlarged view of a section around a terminal holding part of the terminal protection cover shown in FIG. 3.
Figure 5:
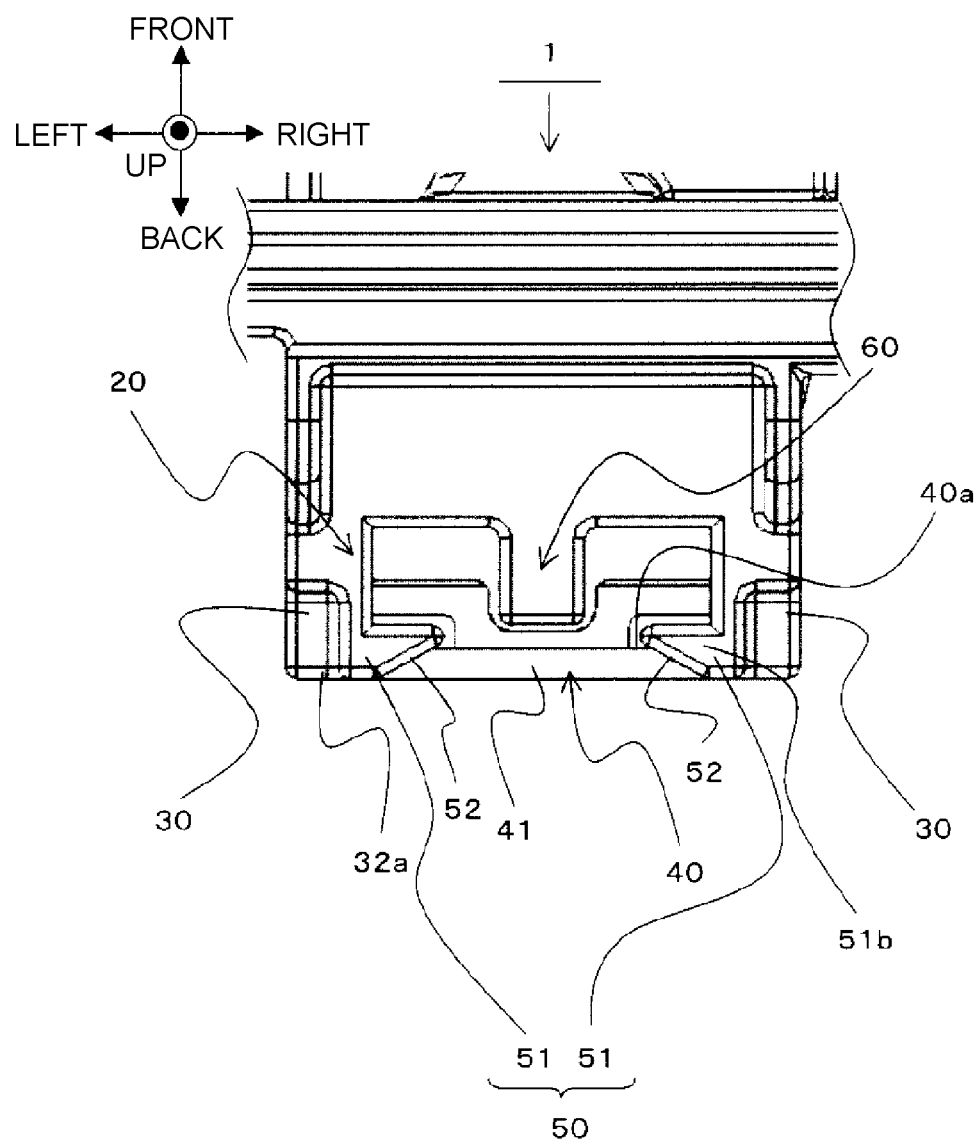
FIG. 5 is an enlarged view of a section around a terminal holding part of the terminal protection cover shown in FIG. 1 when viewed from an upper side.
Figure 6:
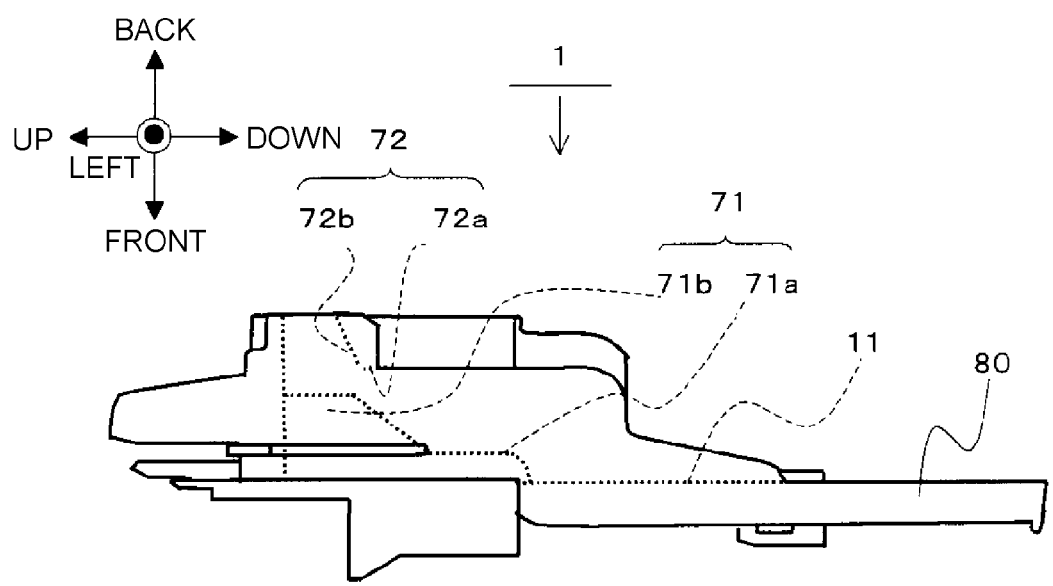
FIG. 6 is a left-side view of the terminal protection cover shown in FIG. 1.
Figure 7:
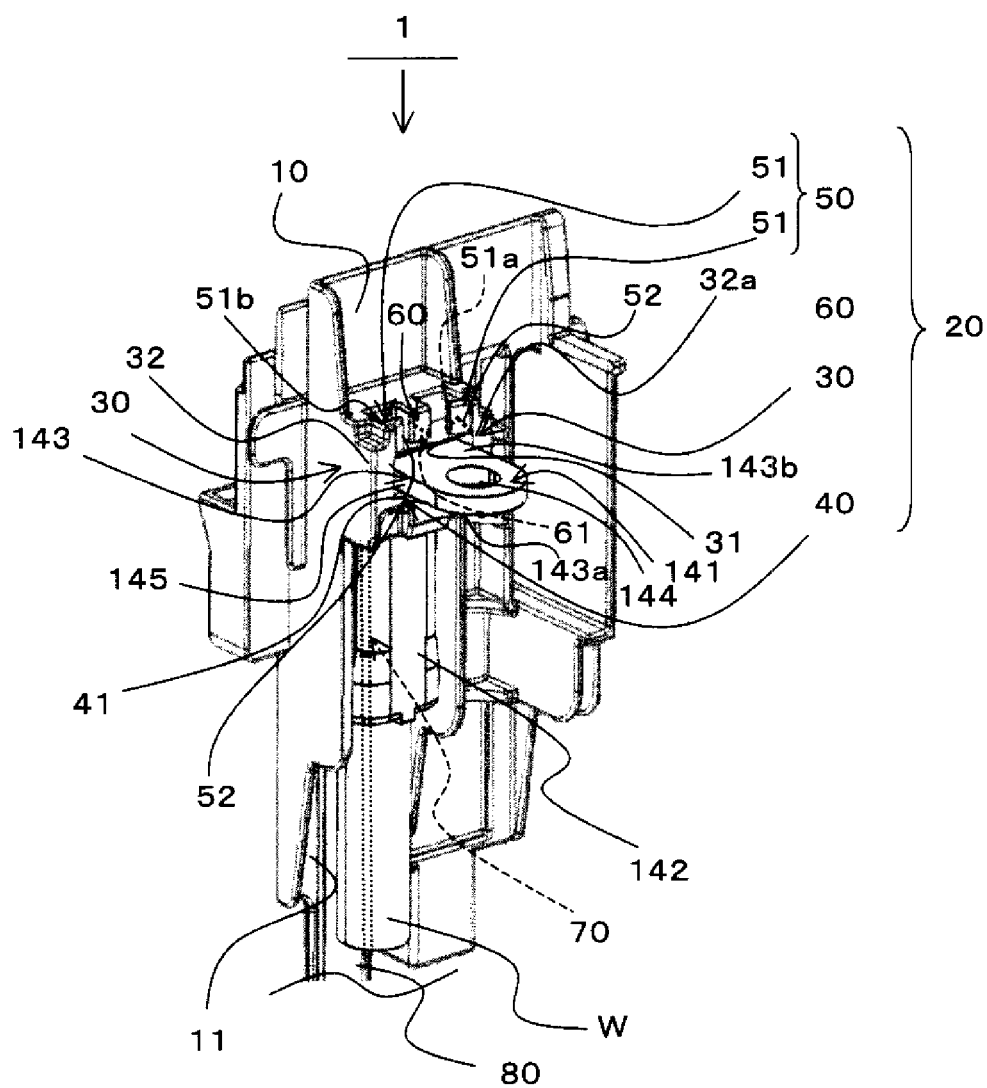
FIG. 7 is a perspective view of the terminal protection cover shown in FIG. 3 to which a terminal-fitted electric wire is set.

FIG. 2 is a side view of the terminal protection cover 1 shown in FIG. 1 when viewed from a side of a surface 11 to which the terminal protection cover is attached, FIG. 3 is a perspective view of the terminal protection cover 1 shown in FIG. 1 when viewed from the side of the surface 11 to which the terminal protection cover is attached, FIG. 4 is an enlarged view of a section around a terminal holding part 20 of the terminal protection cover 1 shown in FIG. 3, FIG. 5 is an enlarged view of a section around a terminal holding part 20 of the terminal protection cover 1 shown in FIG. 1 when viewed from an upper side, FIG. 6 is a left-side view of the terminal protection cover 1 shown in FIG. 1, and FIG. 7 is a perspective view of the terminal protection cover 1 shown in FIG. 3 to which a terminal-fitted electric wire 140 is set. In the meantime, for convenience, front and back directions, right and left directions, and up and down directions are indicated by arrows as shown in the drawings.

The terminal protection cover 1 according to an embodiment of the present invention serves to protect a bent plate-type terminal of a terminal-fitted electric wire 140 which is attached to an electrical junction box 100, which is mounted in a vehicle or the like. The electrical junction box 100 has a body section 100, upper and lower parts of which are covered with an upper cover section 120 and a lower cover section 130, respectively.

First, the body section 110 will be described.

The body section 110 is a box section that accommodates electrical components 111a such as connectors, relays, fuses, etc. and forms a main accommodation part of the electrical junction box 100.

The body section 110 is made of electrically insulating synthetic resin, and has an outer contour that is defined by a barrel type outer wall. The body section 110 has a partition wall 110a which allows a cassette block 111, in which electrical components 111a are mounted, to be dividedly accommodated in the body section.

The body section 110 has, on an outer surface 110b thereof, a box-side groove part 110c which extends linearly from an upper end to a lower end thereof and in which a bent plate-type terminal of a terminal-fitted electric wire 140 is accommodated.

The bent plate-type terminal 141 is formed by bending a plate-type conductive member at a right angle, and has a wire-connection part 142 which serves as a connector for a wire part W, and a leading bent part 143 which is bent at a substantially right angle from the wire-connection part 142 and has a circular tip end. The leading bent part 143 serves as a counter connector for a mating terminal which is not shown in the drawings, and has a screw-insertion hole 144 through which a screw is inserted so as to fix the mating terminal.

As shown in FIG. 7, the terminal-fitted wire 140 is configured such that the bent plate-type terminal 141 is accommodated in the box-side groove part 110c, and the wire part W is drawn from a groove part 131 of the lower cover section 130 and is connected to an external power supply which is not shown in the drawings.

The terminal protection cover 1 slides along the box-side groove part 110c from the upper side toward the lower side and is attached to the box-side groove part 110c.

Next, the upper cover section 120 will be described.

The upper cover section 120 has a shape whose bottom is open, and as shown in FIG. 1, is mounted on the body section 110 when a lower end edge thereof surrounds an upper end edge of the body section 110.

Next, the terminal protection cover 1 will be described.

The terminal protection cover 1 is a cover that includes a terminal holding part 20 in which the bent plate-type terminal 141 of the terminal-fitted wire 140 is held, and protects the bent plate-type terminal 141. The terminal protection cover 1 is attached to the body section 110 to shield the box-side groove part 110c in which the bent plate-type terminal 141 is accommodated.

The terminal holding part 20 is provided on a surface of a planar base part 10, i.e., a main body, of the terminal protection cover 1, which is attached to the body section 110.

The terminal holding part 20 includes a pair of lateral shaking-preventing wall parts 30, and a first vertical shaking-preventing wall part 40, a second vertical shaking-preventing wall part 50, and a third vertical shaking-preventing wall part 60 so that the bent plate-type terminal 141 is held by the wall parts.

The pair of lateral shaking-preventing wall parts 30 stand from the attachment-side surface 11 of the terminal protection cover 1 and has surfaces 31 which face lateral end edge surfaces 145, respectively, of the bent plate-type terminal 141 which is held therein.

The first vertical shaking-preventing wall part 40 is a wall that extends between tip end edges 32 of the pair of the lateral shaking-preventing wall parts 30 on the side toward which the lateral shaking-preventing wall parts stand, and has a first end edge surface 41 that faces an inner surfaces 143a of the leading-side bent part 143 of the bent plate-type terminal 141 which is held therein.

The second vertical shaking-preventing wall part 50 is a wall part that is as a pair of protruding wall parts 51, each of which protrudes from the standing-side tip end edge 32 of respective one of the lateral shaking-preventing wall parts 30 toward the standing-side tip end edge 32 of the other lateral shaking-preventing wall part 30 and has a second end edge surface 51a which faces an outer surface 143b of the leading-side bent part 143 of the bent plate-type terminal 141 which is held therein.

Each of the protruding wall parts 51 has a surface 52 on the same side as a standing-side tip end edge surface 32a of the lateral shaking-preventing wall part 30, which surface 52 is formed to be recessed relative to the standing-side tip end edge surface 32a from the second end edge surface 51a to an upper edge surface 51b therefrom.

Thus, when the bent plate-type terminal 141 is attached, the protruding wall parts 51 do not interfere with a motion of a tip portion of the leading-side bent part 143, so that a distance between the second end edge surface 51a and the first end edge surface 41 can be set to the minimum.

Further, each of the surfaces 52 is inclined so that a thickness thereof decreases from the standing-side tip end edge 32 of the lateral shaking-preventing wall part 30 towards the direction of protrusion. That is, each of the protruding wall parts 51 has the configuration in which the surface 52 is recessed relative to the standing-side tip end edge surface 32a so as to prevent itself from interfering with a motion of the bent plate-type terminal 141, and also has a cross section area that is not as small as possible.

The third vertical shaking-preventing wall part 60 is a wall part that stands from the attachment-side surface 11 between the second vertical shaking-preventing wall pars 50 to a level lower than the standing-side tip end edge surface 32a, and has a third end edge surface 61 which faces the outer surface 143b of the leading-side bent part 143 of the bent plate-type terminal 141 which is held therein.

The third vertical shaking-preventing wall part 60 is formed to be lower than the pair of protruding wall parts 51 relative to the standing-side tip end edge surface 32a. Thus, when the bent plate-type terminal 141 is attached, the third vertical shaking-preventing wall part 60 does not interfere with a motion of the tip portion of the leading-side bent part 143.

The terminal protection cover 1 further includes a guiding wall part 70, which guides the bent plate-type terminal 141 to an attachment-completion position when the bent plate-type terminal 141 is being attached, and a wire-fixing part 80 which fixes a portion of the wire part W.

The guiding wall part 70 consists of first guiding wall parts 71 on the side of the attachment surface, and a second guiding wall part 72 on the side of the shaking-preventing wall part.

The first guiding wall parts 71 consist of a pair of guiding walls which stands in parallel from the attachment-side surface 11, and each of the first guiding part 71 extends linearly from a position below the first vertical shaking-preventing wall part 40 to a position below the third vertical shaking-preventing wall part 60.

As shown in FIG. 6, each of the first guiding wall parts 71 has a step part that guides the bent plate-type terminal 141 to move close to the first vertical shaking-preventing wall part 40 from the attachment-side surface 11 at the attachment-completion position of the bent plate-type terminal 141.

More specifically, each of the first guiding wall part 71 consists of a lower side guide step part 71a which is stepped from the lower side of the attachment-side surface 11, and an upper side guide step part 71b which is stepped from the upper side of the lower side guide step part 71a so as to be further close to the first vertical shaking-preventing wall part 40.

The second guiding wall part 72 on the side of the shaking-preventing wall part is provided on a inner wall surface of the first vertical shaking-preventing wall part 40, and has a parallel guide surface 72a which is parallel to the attachment-side surface 11, and an inclined guide surface 72b which extends from an upper end of the parallel guide surface 72a towards and close to the inner wall surface 40a.

The wire-fixing part 80 extends downwards in a piece form from a lower portion of the planar base part 10, and has a semi-circular cross section which corresponds to a diameter of the wire part W so as to fit and hold the wire part W therein. The wire part W is fixed to the wire-fixing part 80 by means of an adhesive tape or the like, which is not shown in the drawings.

Here, a procedure of attaching the bent plate-type terminal 141 to the terminal protection cover 1 will be described with reference to FIGS. 8A to 9C. FIGS. 8A to 9C are side views showing a procedure of attaching the bent plate-type terminal 141 to the terminal protection cover 1.

First, a user starts moving the bent plate-type terminal 141 so that the leading-side bent part 143 of the bent plate-type terminal 141 approaches the inner wall surface 40a of the first vertical shaking-preventing wall part 40 (see FIGS. 8A to 8C). Here, when moved, the bent plate-type terminal 141 is guided by the first guiding wall parts 70.

Figure 9A:
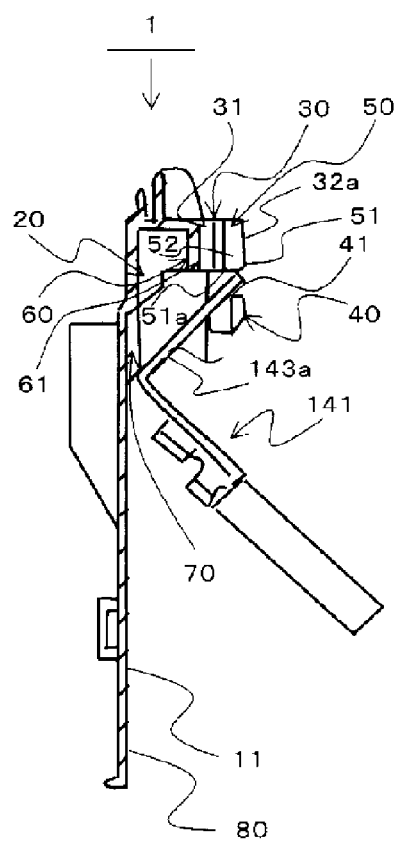
FIGS. 9A to 9C are side views showing a subsequent procedure of attaching the bent plate-type terminal to the terminal protection cover.
Figure 9B:
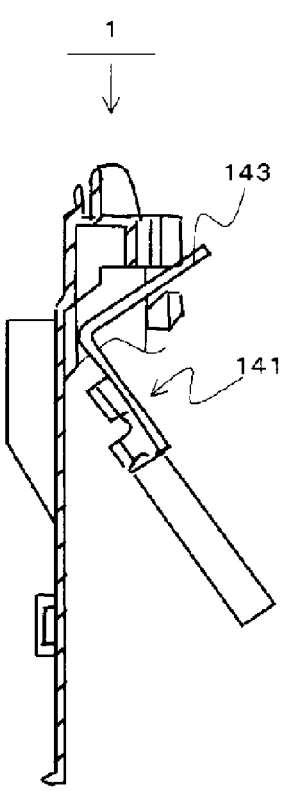

Next, the user moves the bent plate-type terminal 141 so that the leading-side bent part 143 of the bent plate-type terminal 141 is positioned between the first and second vertical shaking-preventing wall parts 40 and 50 (see FIGS. 9A and 9B). Here, the tip portion of the leading-side bent part 143 moves into a place between the first and second vertical shaking-preventing wall parts 40 and 50, following a turning path.

Here, although the tip portion of the leading-side bent part 143 is moved while being positioned on the upper side relative to the second end edge surface 51a of the protruding wall part 51, the surface 52 on the same side as the standing-side tip end edge surface 32a of the lateral shaking-preventing wall part 30 is formed to be recessed relative to the standing-side tip end edge surface 32a from the second end edge surface 51a to the upper end edge surface 51b, so that the respective protruding wall parts 51 do not interfere with a motion of the leading-side bent part 143.

More specifically, when moved around the pair of protruding wall parts 51, the bent plate-type terminal 141 is moved such that the circular tapered-tip portion of the bent plate-type terminal 141 first comes close to a deeply-recessed position of the surfaces 52 of the pair of the protruding wall parts 51 where a distance between the surfaces 52 is relatively short, and then a circular wide portion of the bent plate-type terminal 141 comes close to a shallow-recessed position of the surfaces 52 of the pair of the protruding wall parts 51 where a distance between the surfaces is relatively long. That is, because the respective surfaces 52 of the pair of the protruding wall parts 51 are inclined, the surfaces 52 do not interfere with a motion of the circular tip portion of the bent plate-type terminal 141.

Figure 9C:
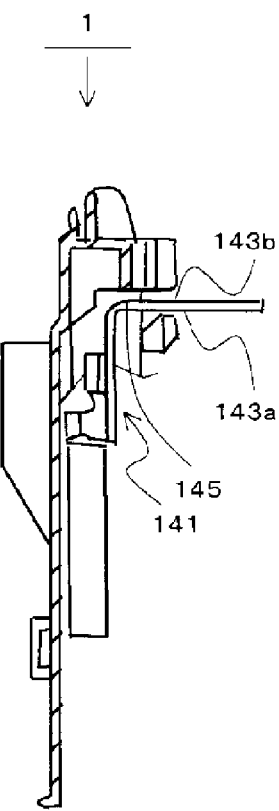

Next, the user disposes the bent plate-type terminal 141 at its attachment-completion position by moving the bent plate-type terminal 141 such that the leading-side bent part 143 thereof takes a parallel position and the tip portion of the bent part comes out through a portion between the first vertical shaking-preventing wall part 40 and the protruding wall part 51 (see FIG. 9C). As a result, the bent plate-type terminal 141 is disposed at a position which is surrounded by the first to third vertical shaking-preventing wall parts 40, 50, and 60, and the pair of lateral shaking-preventing wall parts 30. Thereby, the bent plate-type terminal 141 is restricted from moving in both vertical and lateral directions by means of the first to third vertical shaking-preventing wall parts 40, 50, and 60, and the pair of the lateral shaking-preventing wall parts 30, respectively.

Meanwhile, after the bent plate-type terminal 141 is disposed at its attachment-completion position, the user can fix the bent plate-type terminal 141 to the terminal protection cover 1 more stably by fixing the wire part W to the wire-fixing part 80 using an adhesive tape or the like.

In the terminal protection cover 1 according to the embodiment of the present invention, since the bent plate-type terminal 141 is mounted such that the leading-side bent part 143 thereof is disposed at a position surrounded by the first and second vertical shaking-preventing wall parts 40 and 50, and the pair of lateral shaking-preventing wall parts 60, and the surface 52 of the second vertical shaking-preventing wall part 50 on the same side as the tip end edge surface 32a in the standing direction is recessed relative to the tip end edge surface 32a, a distance between the first and second end edge surfaces 41 and 51a can be set to the minimum so that the second vertical shaking-preventing wall part 50 is prevented from interfering with a motion of the bent plate-type terminal 141 when mounted to the terminal protection cover, thereby facilitating easy mounting of the bent plate-type terminal 141 and preventing the bent plate-type terminal 141 from shaking.

In the terminal protection cover 1 according to the embodiment of the present invention, each of the protruding wall parts 51 has, on the same side as the tip end edge surface 32a in the standing direction, an inclined surface whose thickness decreases in the direction of protrusion, so that a cross section area of the protruding wall part can be set to the maximum so as to prevent the protruding wall part from interfering with a motion of the circular tip portion of the bent plate-type terminal 141, thereby increasing the strength of the protruding wall parts, and the second end edge surface 51a facing the outer surface of the leading-side bent part 143 of the bent plate-type terminal 141 can be set to have a large area, thereby improving the shaking-preventing effects of the bent plate-type terminal 141.

In the terminal protection cover 1 according to the embodiment of the present invention, the third vertical shaking-preventing wall part 60 is provided between the pair of protruding wall parts 51 such that the third vertical shaking-preventing wall part does not interfere with a motion of the bent plate-type terminal 141, thereby further improving the shaking-preventing effects of the bent plate-type terminal 141.

In the terminal protection cover 1 according to the embodiment of the present invention, the bent plate-type terminal 141 is guided along the guiding wall part 70 to an attachment-completion position, thereby facilitating easy mounting of the bent plate-type terminal 141.

In the electrical junction box 100 according to the embodiment of the present invention, the bent plate-type terminal 141 is protected by the terminal protection cover 1, thereby facilitating easy mounting of the bent plate-type terminal 141 and preventing the shaking of the bent plate-type terminal 141.

First Modified Embodiment

Figure 10:
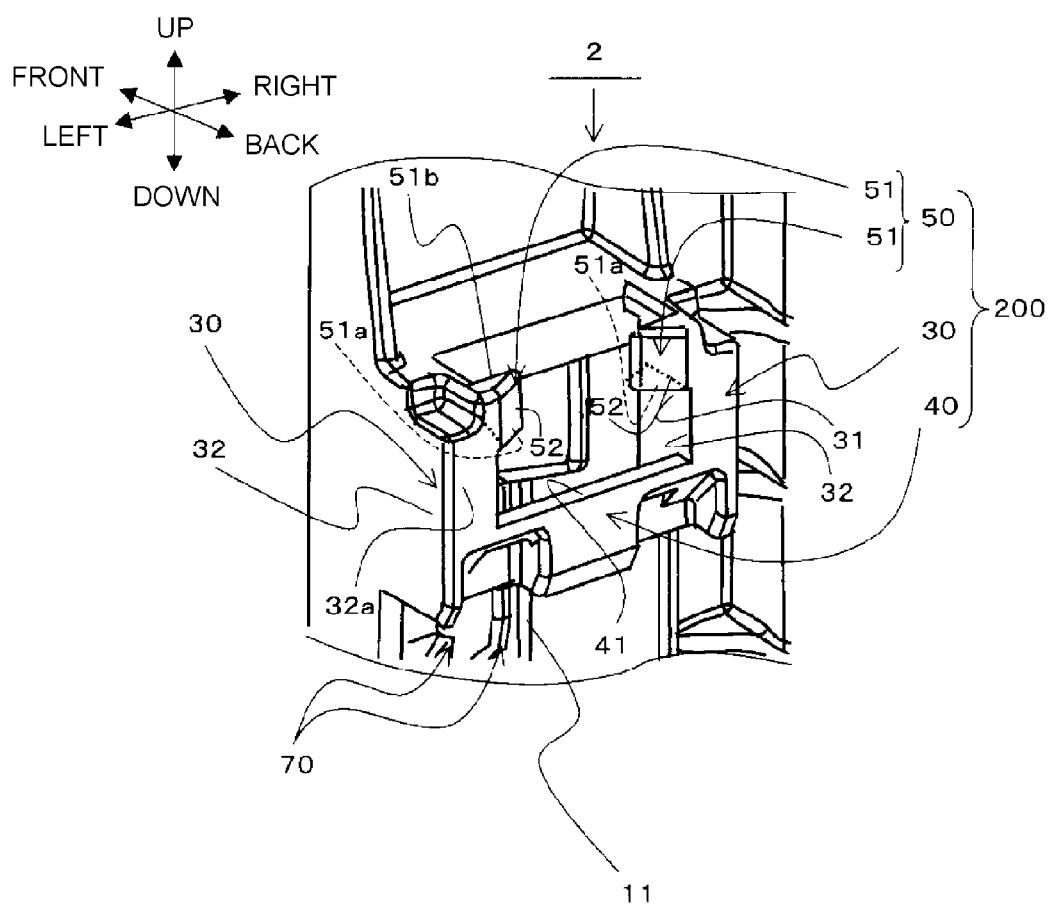
FIG. 10 is an enlarged perspective view of a section around a terminal holding part of a terminal protection cover according to a first modified embodiment of the present invention.

Next, a terminal protection cover according to a first modified embodiment of the present invention will be described with reference to FIG. 10. FIG. 10 is an enlarged perspective view of a section around a terminal holding part 200 of a terminal protection cover 2 according to a first modified embodiment of the present invention.

The terminal protection cover 2 of the first modified embodiment is different from the terminal protection cover 1 of the former embodiment in that a terminal holding part 200 is provided instead of the terminal holding part 20.

The other configuration is identical to that of the former embodiment, and like reference signs indicate like elements in the former embodiment.

The terminal holding part 200 includes a first vertical shaking-preventing wall part 40 and a second vertical shaking-preventing wall part 50, except the third vertical shaking-preventing wall part 60.

Like the terminal protection cover 1 of the former embodiment, the terminal protection cover 2 of the first modified embodiment can facilitate easy mounting of the bent plate-type terminal 141, and prevent the bent plate-type terminal 141 from shaking.

Second Modified Embodiment

Figure 11:
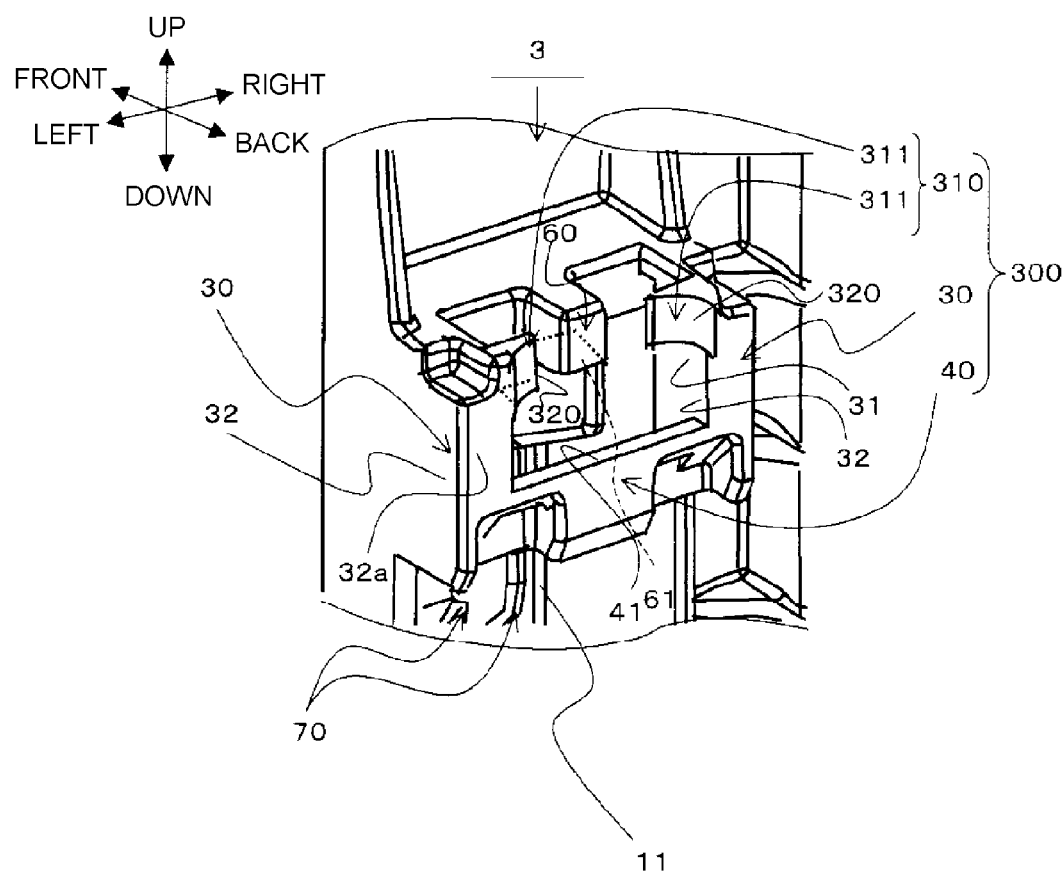
FIG. 11 is an enlarged perspective view of a section around a terminal holding part of a terminal protection cover according to a second modified embodiment of the present invention.

Next, a terminal protection cover according to a second modified embodiment of the present invention will be described with reference to FIG. 11. FIG. 11 is an enlarged perspective view of a section around a terminal holding part 300 of a terminal protection cover 3 according to a second modified embodiment of the present invention.

The terminal protection cover 3 of the second modified embodiment is different from the terminal protection cover 1 of the former embodiment in that a terminal holding part 300 is provided instead of the terminal holding part 20.

The other configuration is identical to that of the former embodiment, and same reference signs indicate the same elements in the former embodiment.

The terminal holding part 300 is configured such that a second vertical shaking-preventing wall part 310 thereof consists of a pair of protruding wall parts 311, wherein a surface 320 of each of the protruding wall part 311, which is on the same side as a tip end edge surface 32a of a lateral shaking-preventing wall part 30 in the standing direction, has a curved shape such that a thickness thereof decreases in the direction of protrusion.

The terminal protection cover 3 of the second modified embodiment has the same effects as the terminal protection cover 1 of the former embodiment.

Third Modified Embodiment

Figure 12:
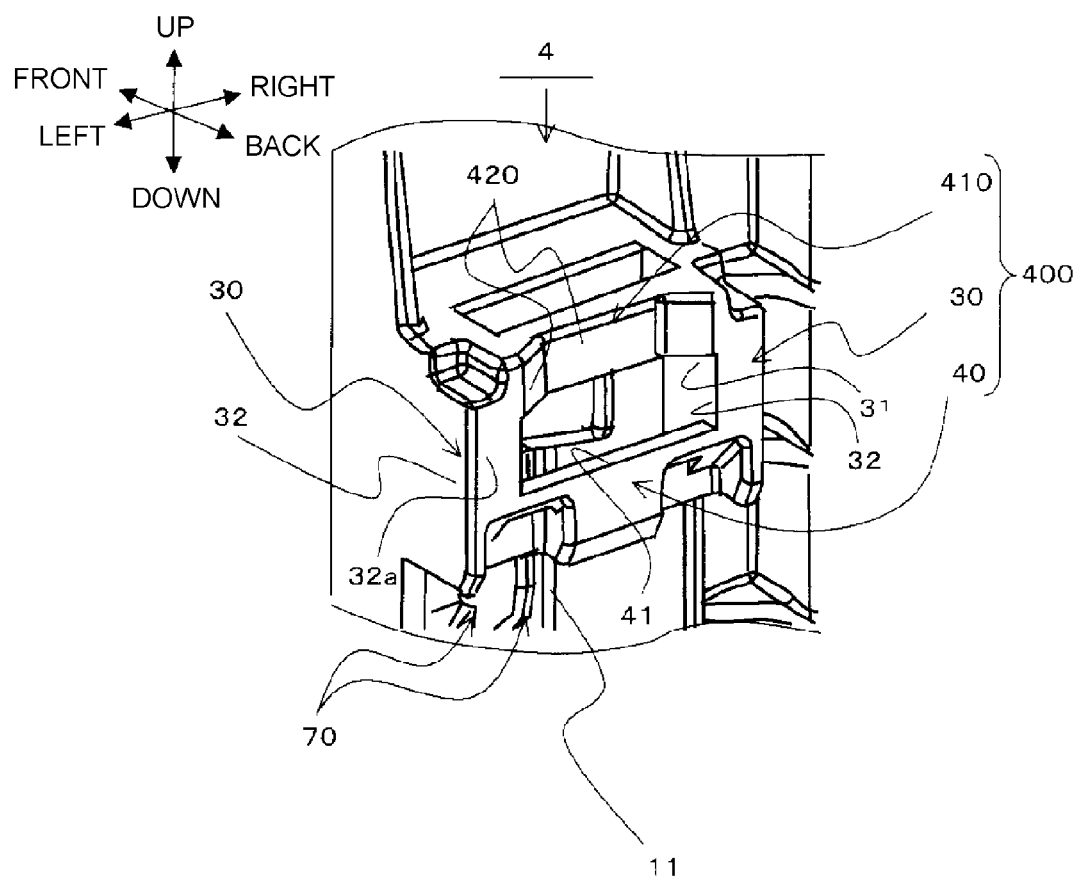
FIG. 12 is an enlarged perspective view of a section around a terminal holding part of a terminal protection cover according to a third modified embodiment of the present invention.

Next, a terminal protection cover according to a third modified embodiment of the present invention will be described with reference to FIG. 12. FIG. 12 is an enlarged perspective view of a section around a terminal holding part 400 of a terminal protection cover 4 according to a third modified embodiment of the present invention.

The terminal protection cover 4 of the second modified embodiment is different from the terminal protection cover 1 of the former embodiment in that a terminal holding part 400 is provided instead of the terminal holding part 20.

The other configuration is identical to that of the former embodiment, and same reference signs indicate the same elements in the former embodiment.

The terminal holding part 400 is configured such that a second vertical shaking-preventing wall part 410 thereof is a wall part that extends between tip end edge 32 of a pair of lateral shaking-preventing wall parts 30 in the standing direction, on the upper side of a first vertical shaking-preventing wall part 40, wherein a surface 420 thereof, which is on the same side as a tip end edge surface 32a of a lateral shaking-preventing wall part 30 in the standing direction, is formed to be recessed relative to the tip end edge surface 32a in the standing direction.

The terminal protection cover 4 of the third modified embodiment has the same effects as the terminal protection cover 1 of the former embodiment.

Fourth Modified Embodiment

Figure 13:
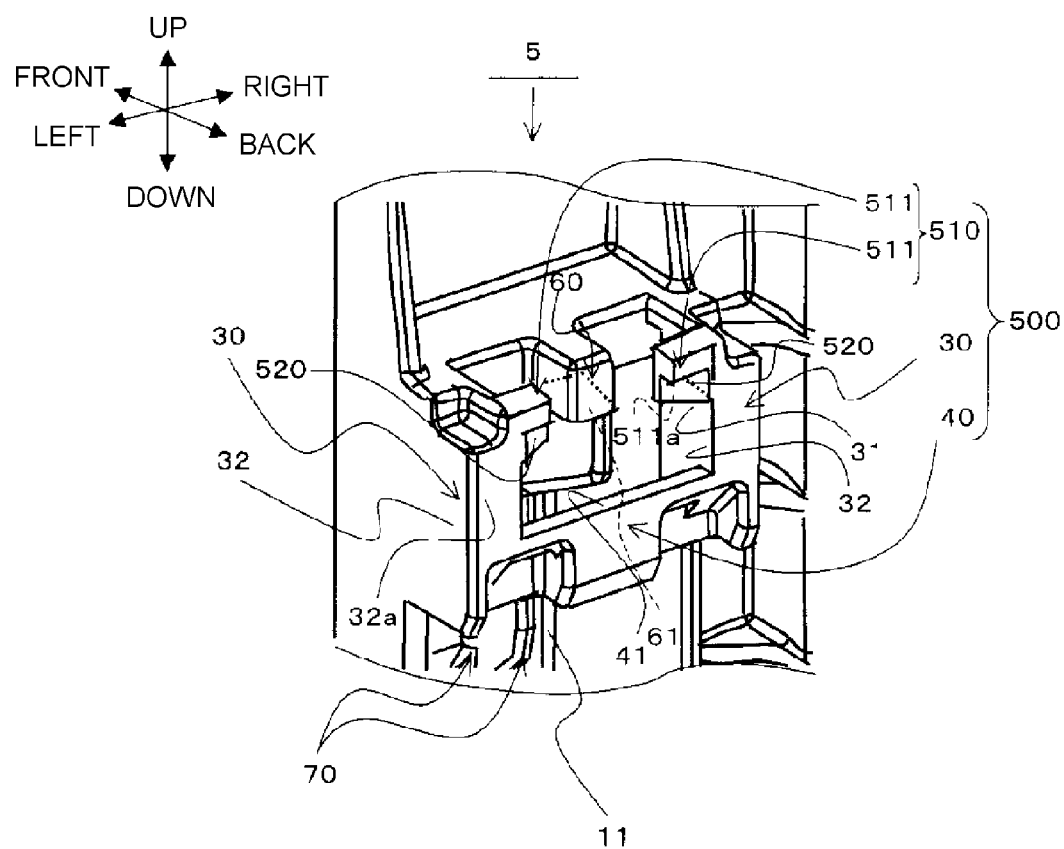
FIG. 13 is an enlarged perspective view of a section around a terminal holding part of a terminal protection cover according to a fourth modified embodiment of the present invention.

Next, a terminal protection cover according to a fourth modified embodiment of the present invention will be described with reference to FIG. 13. FIG. 13 is an enlarged perspective view of a section around a terminal holding part 500 of a terminal protection cover 5 according to the fourth modified embodiment of the present invention.

The terminal protection cover 5 of the fourth modified embodiment is different from the terminal protection cover 1 of the former embodiment in that a terminal holding part 500 is provided instead of the terminal holding part 20.

The other configuration is identical to that of the former embodiment, and same reference signs indicate the same elements in the former embodiment.

The terminal holding part 500 is configured such that a surface 520 of each of the protruding wall parts 511 of a second vertical shaking-preventing wall part 510, which is on the same side as a tip end edge surface 32a of a lateral shaking-preventing wall part 30 in the standing direction, is formed to be recessed relative to the tip end edge surface 32a in the standing direction, to a certain position upwards from a second end edge surface 511a.

The terminal protection cover 5 of the fourth modified embodiment has the same effects as the terminal protection cover 1 of the former embodiment.

Fifth Modified Embodiment

Figure 14:
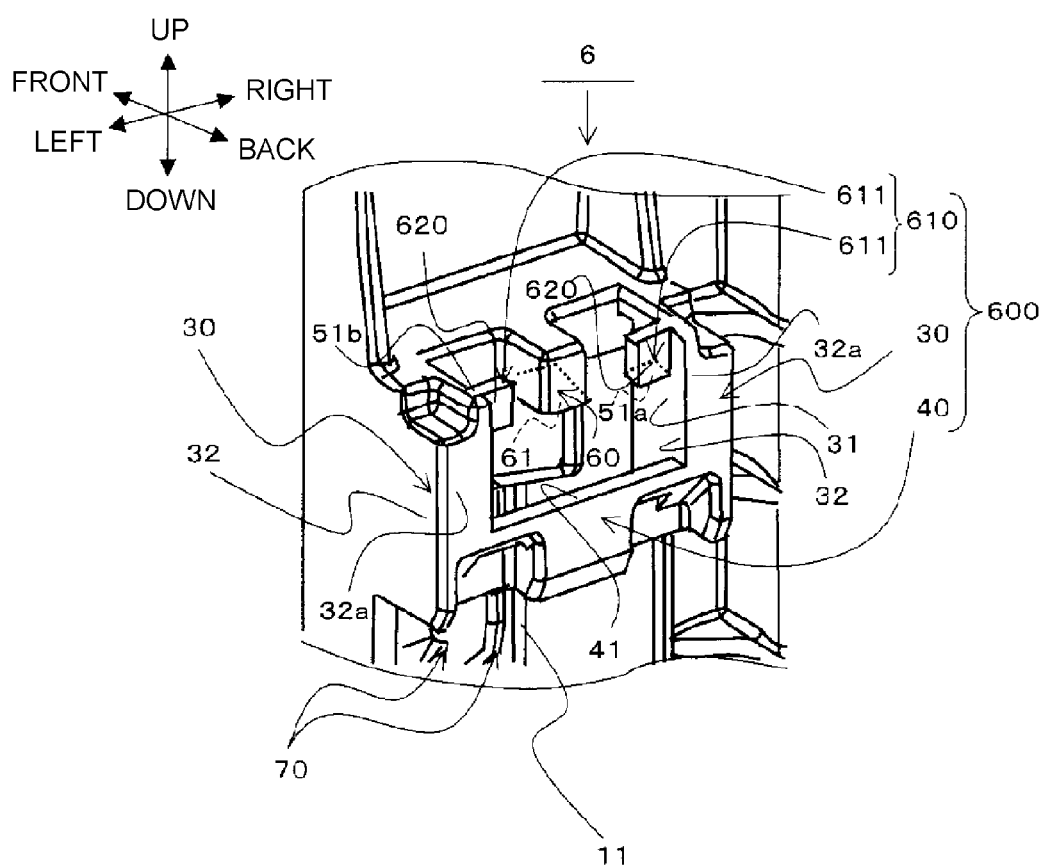
FIG. 14 is an enlarged perspective view of a section around a terminal holding part of a terminal protection cover according to a fifth modified embodiment of the present invention.
Figure 15:
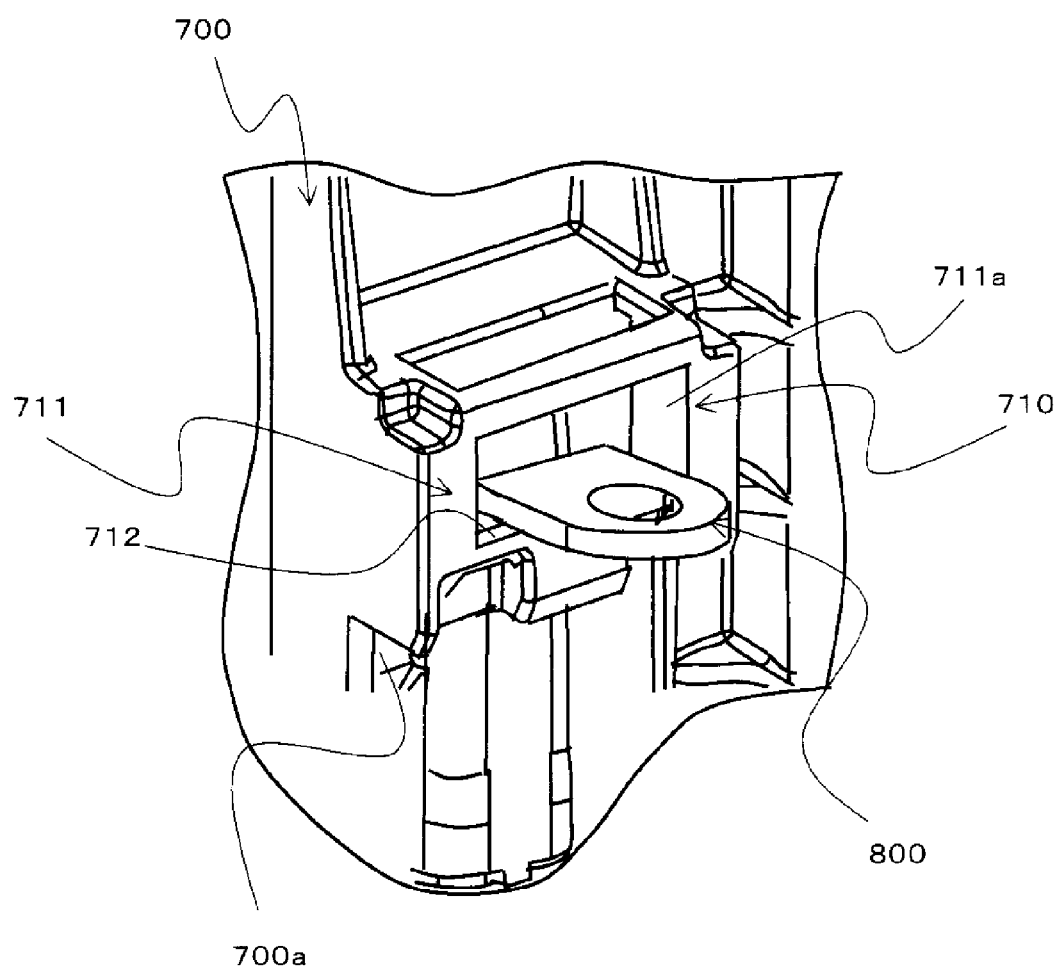
FIG. 15 is an enlarged view showing an example of a terminal protection cover to which a bent plate-type terminal is attached.
Figure 16:
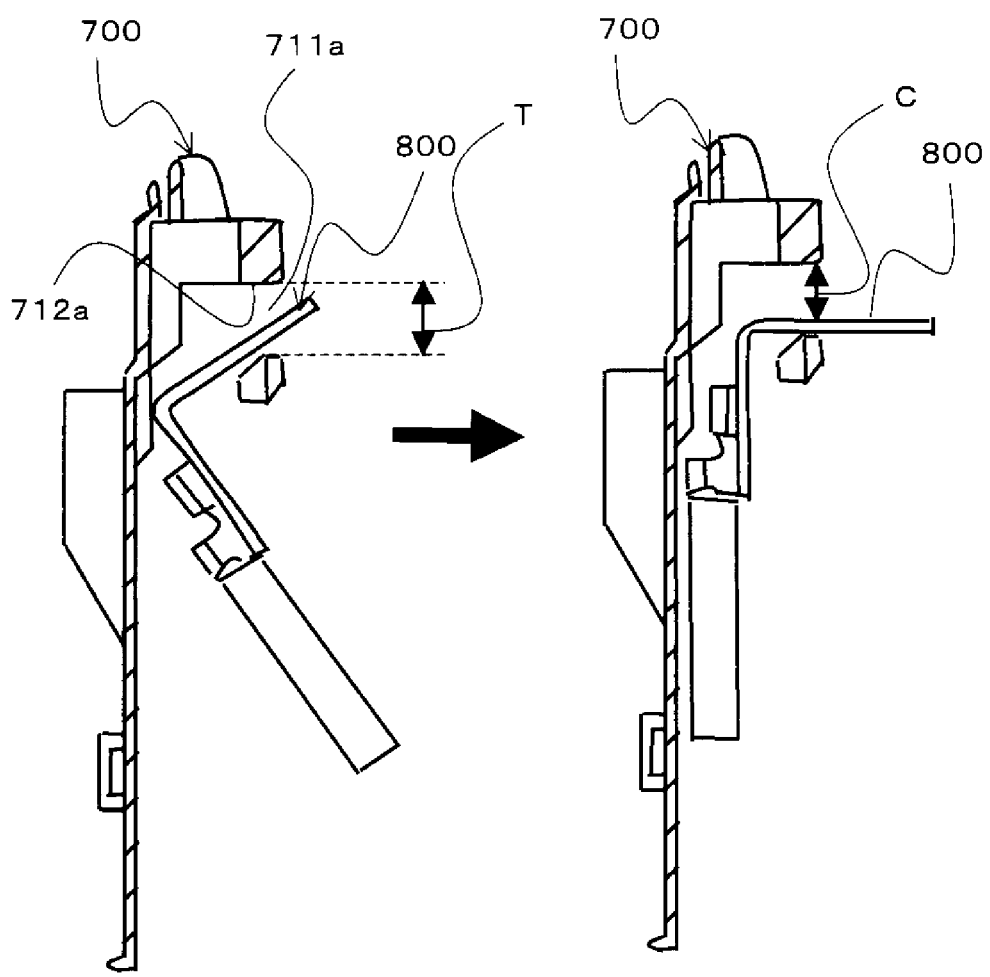
FIG. 16 is a side view showing the bent plate-type terminal being attached to the terminal protection cover shown in FIG. 15 through turning action.

Next, a terminal protection cover according to a fifth modified embodiment of the present invention will be described with reference to FIG. 14. FIG. 14 is an enlarged perspective view of a section around a terminal holding part 600 of a terminal protection cover 6 according to the fifth modified embodiment of the present invention.

The terminal protection cover 6 of the fifth modified embodiment is different from the terminal protection cover 1 of the former embodiment in that a terminal holding part 600 is provided instead of the terminal holding part 20.

The other configuration is identical to that of the former embodiment, and same reference signs indicate the same elements in the former embodiment.

The terminal holding part 600 is configured such that a surface 620 of each of the protruding wall parts 611 of a second vertical shaking-preventing wall part 610, which is on the same side as a tip end edge surface 32a of a lateral shaking-preventing wall part 30 in the standing direction, is formed to be recessed in a stepped form relative to the tip end edge surface 32a in the standing direction.

According to the terminal protection cover 6 of the fifth modified embodiment, although a cross section area of each of the protruding wall parts 611 becomes smaller, the surface 620 is formed to be recessed relative to the tip end edge surface 32a in the standing direction so as to prevent itself from interfering with a motion of the bent plate-type terminal 141. Thereby, similar to the terminal protection cover 1 of the former embodiment, the terminal protection cover of the present embodiment can facilitate easy mounting of the bent plate-type terminal 141 and prevent the bent plate-type terminal 141 from shaking. Further, since the surface 620 is recessed in a stepped form relative to the tip end edge surface 32a in the standing direction, even when the tip portion of the bent plate-type terminal 141 is linear rather than circular, the surface is prevented from interfering with a motion of the bent plate-type terminal.

Although the embodiments of the present invention have illustrated that the terminal protection covers 1, 2, 3, 4, 5, and 6 are incorporated in the electrical junction box 100, the present invention is not limited to the embodiments. The terminal protection covers may be incorporated in other electrical connection units.

Although the present invention contrived by the inventors has been described in detail based on the above-mentioned embodiments, the present invention is not limited thereto, and various modifications are possible, without departing from the scope and spirit of the present invention.

This application is based upon and claims the benefit of priority of Japanese Patent Application No. 2012-121551 filed on May 29, 2012, the contents of which are incorporated herein by reference in its entirety.

What is claimed is:

1. A terminal protection cover comprising a terminal holding part for holding a bent plate-type terminal formed by bending a plate-type conductive member at a right angle, wherein the terminal holding part includes:

a pair of lateral shaking-preventing wall parts which stands from a terminal-attachment surface of the terminal protection cover, and have surfaces facing lateral end edge surfaces, respectively, of the bent plate-type terminal which is held therein;

a first vertical shaking-preventing wall part which is a first wall extending between tip end edges of the pair of the lateral shaking-preventing wall parts on a side toward which the lateral shaking-preventing wall parts stand, and has first end edge surfaces facing inner surfaces, respectively, of a leading-side bent part of the bent plate-type terminal which is held therein; and a second vertical shaking-preventing wall part which is either a wall extending between the tip end edge surfaces of the pair of lateral shaking-preventing wall parts, or a pair of protruding walls extending from respective one of the tip end edge surfaces of the pair of lateral shaking-preventing wall parts towards the other one of the tip end edge surfaces of the pair of lateral shaking-preventing wall part, at a position upwards from the first vertical shaking-preventing wall part, and has a second end edge surface facing an outer surface of the leading-side bent part of the bent plate-type terminal which is held therein, wherein the second vertical shaking-preventing wall part has a surface which is on the same side as the tip end edge surface of the lateral shaking-preventing wall part, and which is formed to be recessed relative to the tip end edge surface at a certain position upwards from the second end edge surface, or from the second end edge surface to an upper edge surface therefrom.

2. The terminal protection cover according to claim 1, wherein the second vertical shaking-preventing wall part is the pair of protruding wall parts, and a surface of each of the protruding wall parts on the same side as the tip end edge surface is inclined so that a thickness of the protruding wall part decreases in a direction of protrusion.

3. The terminal protection cover according to claim 1, wherein the second vertical shaking-preventing wall part is the pair of protruding wall parts, and the terminal holding part further includes a third vertical shaking-preventing wall part which stands from the terminal-attachment surface between the pair of protruding wall parts to a level recessed relative to the tip end edge surface, and has a third end edge surface facing the outer surface of the leading-side bent part of the bent plate-type terminal which is held therein.

4. The terminal protection cover according to claim 1, wherein the terminal holding part further includes a guiding wall part which guides the bent plate-type terminal to an attachment-completion position when the bent plate-type terminal is being attached.

5. An electrical junction box in which a terminal-fitted electric wire having a bent plate-type terminal is attached to an outer surface of the electrical junction box, the electrical junction box comprising the terminal protection cover according to claim 1 for protecting the bent plate-type terminal.

* * * * *